United States Patent [19]
Ho

[11] Patent Number: 5,967,803
[45] Date of Patent: Oct. 19, 1999

[54] CARD CONNECTOR

[75] Inventor: Yu-Ming Ho, Pan-Chiao, Taiwan

[73] Assignee: Hon Hai Precision Ind. Co., Ltd, Taipei Hsien, Taiwan

[21] Appl. No.: 08/986,274

[22] Filed: Dec. 5, 1997

[30] Foreign Application Priority Data

Dec. 14, 1996 [TW] Taiwan .................................. 85219493

[51] Int. Cl.⁶ ....................................................... H01R 9/09
[52] U.S. Cl. .......................................... 439/79; 439/541.5
[58] Field of Search .............................. 439/79, 80, 541.5

[56] References Cited

U.S. PATENT DOCUMENTS

| | | | |
|---|---|---|---|
| 4,632,493 | 12/1986 | Matsuzaki et al. | 439/79 |
| 4,776,804 | 10/1988 | Johnson et al. | 439/79 |
| 5,194,010 | 3/1993 | Dambach et al. | 439/79 |
| 5,409,384 | 4/1995 | Green et al. | 439/79 |
| 5,580,269 | 12/1996 | Fan | 439/79 |
| 5,643,001 | 7/1997 | Kaufman et al. | 439/541.5 |
| 5,709,568 | 1/1998 | Pan et al. | 439/541.5 |
| 5,772,453 | 6/1998 | Tan et al. | 439/79 |

Primary Examiner—Christopher A. Bennett

[57] ABSTRACT

A stacked card connector (1) includes two insulative housings (10, 11) each having a contact receiving chamber (101) defining a number of contact receiving holes (1013) therethrough for receiving a number of contacts (13). A grounding plate (12) is mounted above each contact receiving chamber (101) for shielding the contacts (13). An ejecting means (16) is connected to each housing (10, 11) for guiding a card to be received in the connector (1) and for ejecting the inserted card. The contacts (13) of each housing (10, 11) are aligned with and inserted in through holes (21) defined through a corresponding daughter board (14) by means of a guiding and fastening means (2) which also securely retains each daughter board (14) at an end of each housing (10, 11). After soldering the contacts (13) and the grounding plates (12) to the corresponding firmly secured daughter board (14), each daughter board (14) is received in a corresponding slot which is mounted to a mother board.

2 Claims, 4 Drawing Sheets

5,967,803

CARD CONNECTOR

BACKGROUND OF THE INVENTION

1. Field of the Invention

The present invention relates to a card connector, and particularly to a stacked card connector having guiding and fastening means for facilitating the connection and retainment of the connector to a daughter board of a computer.

2. The Prior Art

Present laptop computers are often equipped with card connectors for receiving memory cards or I/O cards. One of three different interconnection means is commonly employed for connecting the card connector to the computer. The first type configures the connector to have conductive contacts formed at right angles for directly linking the connector to a mother board. The second kind of interconnection means utilizes a daughter board horizontally arranged with the contacts of the connector and mounted to the mother board by means of an intermediate board-to-board connector. Lastly, a daughter board can be orthogonally fixed between the connector and the mother board by receiving the contacts of the connector in holes defined through a surface thereof for soldering thereto and then being inserted in a socket mounted to the motherboard. The card connector of the present invention refers to this last type of interconnection means.

Related interconnection means have been disclosed in Taiwan Pat. Nos. 80207449, 81216447, 81217278, 82205600, 83107162, 83202199, and 83208140, and in U.S. Pat. Nos. 4,810,203, 4,818,239, 4,878,856, 5,085,590, 5,149,276, 5,176,523, 5,286,207, 5,290,174, 5,324,204, and 5,334,046.

However, the prior art interconnection means has many drawbacks. First of all, alignment and insertion of the contacts of the connector into the holes defined through the daughter board are troublesome. In addition, no fastening means exists between the daughter board and the connector so that when the daughter board is fixed to the connector by performing a wave soldering procedure on the contacts inserted in the daughter board, the two elements will become slightly offset with respect to each other. This leads to defective soldering junctions which result in short or open circuits between adjacent contacts due to misalignment. Furthermore, to obtain better positioning of the contacts with the daughter board, several jig tools are required, thus, making assembly laborious and increasing manufacturing costs.

Hence, there is a need for a card connector with a guiding and fastening means to eliminate the above mentioned defects of current card connectors.

SUMMARY OF THE INVENTION

Accordingly, an objective of the present invention is to provide a card connector having a guiding and fastening means to facilitate the alignment and insertion of a number of contacts of the connector through a corresponding number of holes defined through a daughter board to be mounted to a mother board.

Another objective of the present invention is to provide a card connector having a guiding and fastening means for firmly securing the connector to the daughter board thereby preventing open or short circuits from being formed between adjacent contacts during a soldering procedure performed thereon due to a slight offset of the connector with respect to the daughter board.

A further objective of the present invention is to provide a card connector which does not require the use of external tools to mount the connector to a mother board thereby reducing assembly time and manufacturing costs.

To fulfill the above objectives, according to a preferred embodiment of the present invention, a stacked card connector includes two insulative housings each having a contact receiving chamber defining a number of contact receiving holes therethrough for receiving a number of contacts. A grounding plate is mounted above each contact receiving chamber for shielding the contacts. An ejecting means is connected to each housing for guiding a card to be received in the connector and for ejecting the inserted card. The contacts of each housing are aligned with and inserted in through holes defined through a corresponding daughter board by means of guiding and fastening means which also securely retains each daughter board at an end of each housing. After soldering the contacts and the grounding plates to the corresponding firmly secured daughter board, each daughter board is received in a corresponding slot which is mounted to a mother board.

DETAILED DESCRIPTION OF THE PREFERRED EMBODIMENTS

Reference will now be made in detail to the preferred embodiments of the present invention. To facilitate the understanding of different embodiments, similar components will be labeled with the same numbers throughout the description.

Figure 1:
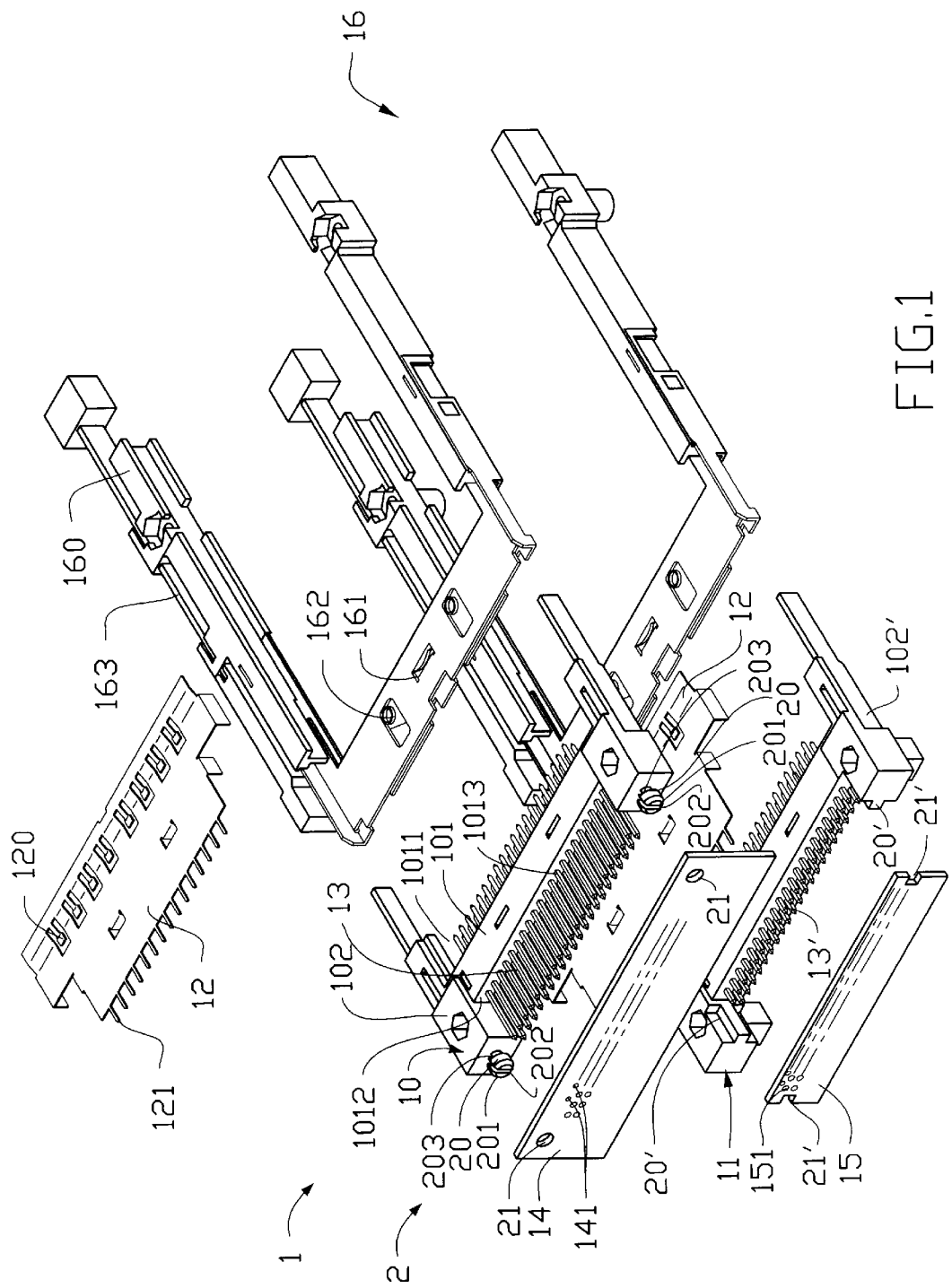
FIG. 1 is an exploded, perspective view of the card connector in accordance with a preferred embodiment of the present invention.

Referring to FIG. 1, a stacked electrical connector 1 in accordance with the present invention includes two stacked insulative housings 10, 11, guiding and fastening means 2, two metal grounding plates 12, a plurality of conductive contacts 13, 13', two daughter boards 14, 15, and ejecting means 16.

Since the insulative housings 10, 11 are identical, only the upper housing 10 will be described. The housing 10 includes a contact receiving chamber 101 having an inserting port 1011 for connecting with an inserted card and a soldering port 1012 for connecting with the daughter board 14. A plurality of contact receiving holes 1013 are defined in the contact receiving chamber 101 between the inserting port 1011 and the soldering port 1012. Two laterally extending arms 102 are attached to each end of the contact receiving chamber 101 so that a contact receiving space (not labeled) is defined between the two arms 102 and the soldering port 1012 of the housing 10.

The guiding and fastening means 2 is formed on each arm 102, 102' on the soldering port 1012 side of each housing 10, 11 for respectively engaging with holes 21 and notches 21' respectively defined in the daughter boards 14, 15. The guiding and fastening means 2 of the upper housing 10 consists of two deformable posts 20 respectively formed on front faces of the arms 102. Each post 20 has a slit 202 defined therethrough for allowing inward deformation of the post 20 and a slanted front periphery 201 for guiding the post 20 into the corresponding hole 21 of the daughter board 14. The diameter of the holes 21 of the daughter board 14 is substantially equal to the diameter of the posts 20 when the posts 20 are in a fully deformed state so that the posts 20 can be readily received in the holes 21 of the daughter board 14. The posts 20 protrude beyond the ends of the contacts 13 for facilitating the guidance of the contacts 13 into a number of through holes 141 defined in the daughter board 14. Each post 20 is further formed with a stopping flange 203 for retaining the posts 20 within the holes 21 of the daughter board 14. The distance from the stopping flange 203 to the front face of the arm 102 of the housing 10 is substantially equal to the width of the daughter board 14 so that the daughter board 14 can be firmly secured between the stopping flanges 203 and the front faces of the arms 102 of the housing 10.

The guiding and fastening means 2 of the lower housing 11 consists of a guiding protrusion 20' horizontally formed on each inner side of the arms 1021 of the housing 11 and projecting into the contact receiving space for respective insertion in the notches 21' defined in opposing lateral ends of the daughter board 15.

The ejecting means 16 comprises a guiding bracket 160, an ejecting plate 161, a lever 162, and a push rod 163. The guiding bracket 160 receives the push rod 163 which is connected to the ejecting plate 161 by means of the lever 162. A card (not shown) received in the card connector 1 can be ejected by pressing the push rod 163 which pivots the lever 162 thereby causing the ejecting plate 161 to push the card out of the connector.

The metal grounding plates 12 are provided above each contact receiving chamber 101 and contact receiving space of the housings 10, 11 for shielding the contacts 13 received therein. One end of the grounding plate 12 is provided with a number of grounding tabs 120 for contacting an inserted card (not shown) and the other end is formed with a number of soldering legs 121.

Figure 2:
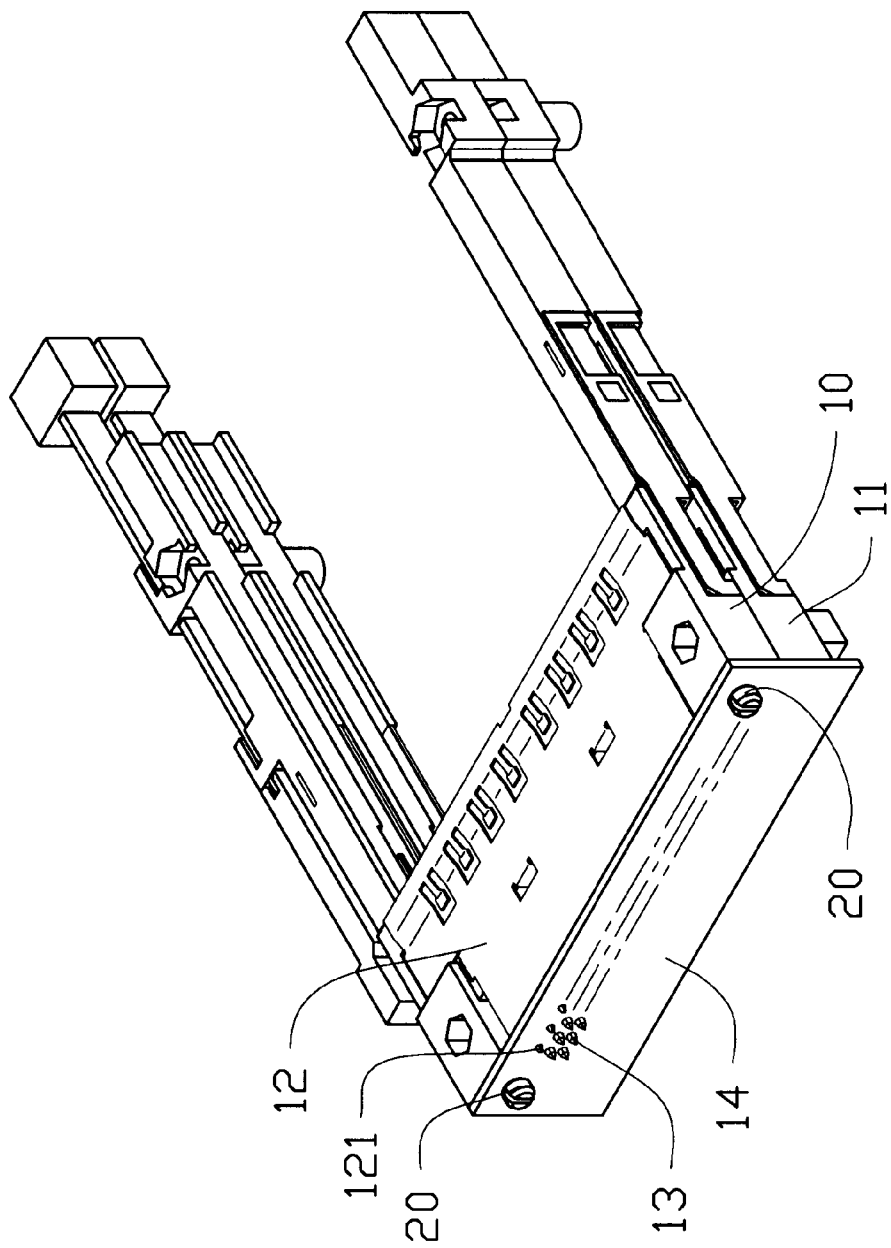
FIG. 2 is a perspective view of the assembled card connector of FIG. 1.

In assembly, the grounding plates 12 are respectively mounted above the housings 10, 11 which are respectively received in the guiding brackets 160 of each corresponding ejecting means 16. The daughter board 15 is mounted to the lower housing 11 by inserting the protrusions 20' through the notches 21' so that the soldering legs 121 of the lower grounding plate 12 and the contacts 13' of the lower housing 11 are guided to be received in through holes 151 defined in the daughter board 15. After the soldering legs 121 of the lower grounding plate 12 and the contacts 13' of the lower housing 11 are soldered to the daughter board 15, the posts 20 of the upper housing 10 are inserted into the holes 21 of the daughter board 14. The slanted surface periphery 201 of each post 20 abuts an inner periphery of the holes 21 causing a deformation of the post 20 as the post 20 passes through the hole 21. When the post 20 is inserted into the hole 21 past the stopping flange 203, the post 20 returns to its original shape and the daughter board 14 is firmly secured on the housing 10. The soldering legs 121 of the upper grounding plate 12 and the contacts 30 of the upper housing 10 are then soldered to the surface of the daughter board 14. The daughter boards 14, 15 are each received in sockets (not shown) mounted on a mother board (not shown). The fully assembled stacked card connector is shown in FIG. 2.

Figure 3:
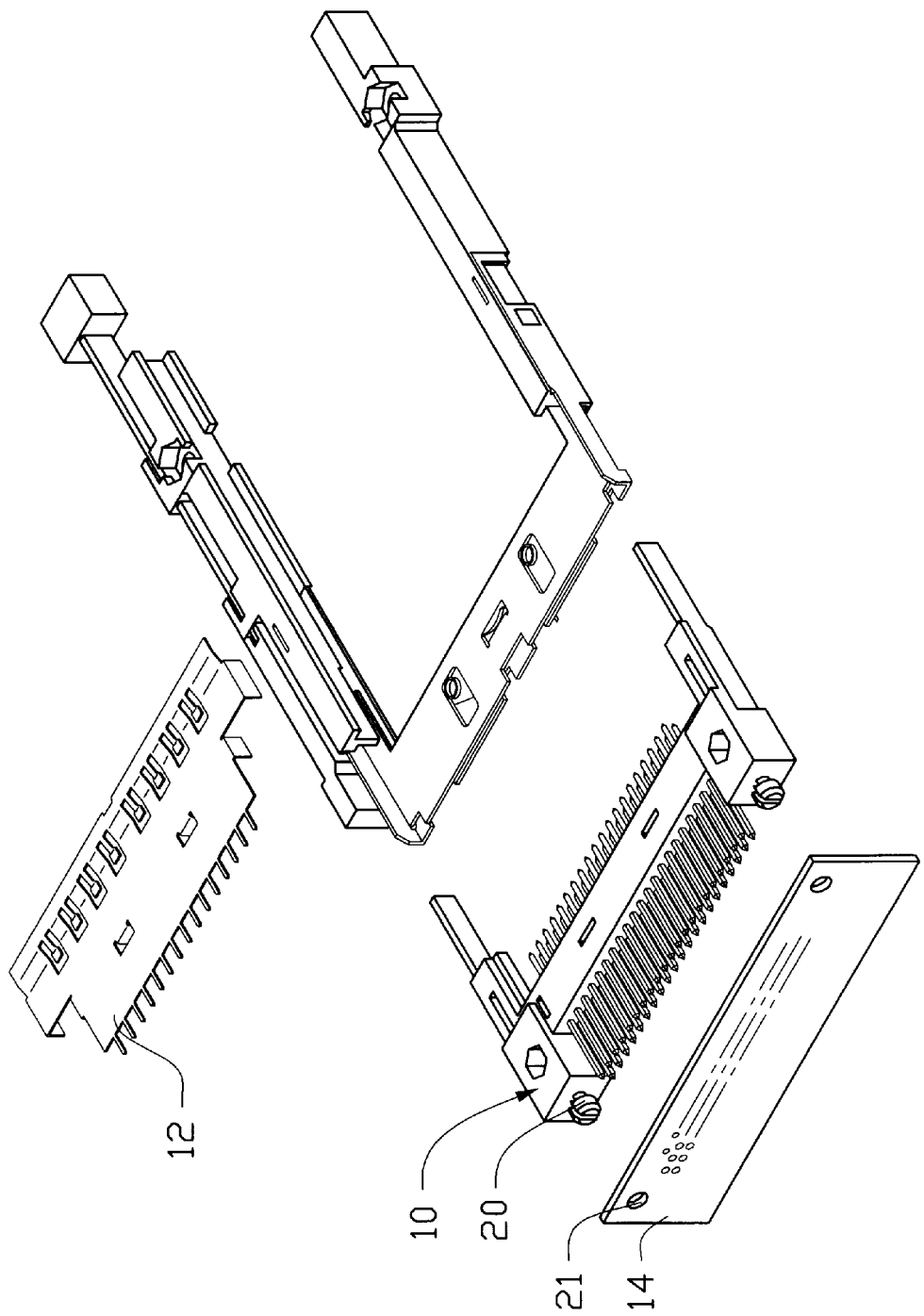
FIG. 3 is an exploded, perspective view of the card connector in accordance with a second embodiment of the present invention.
Figure 4:
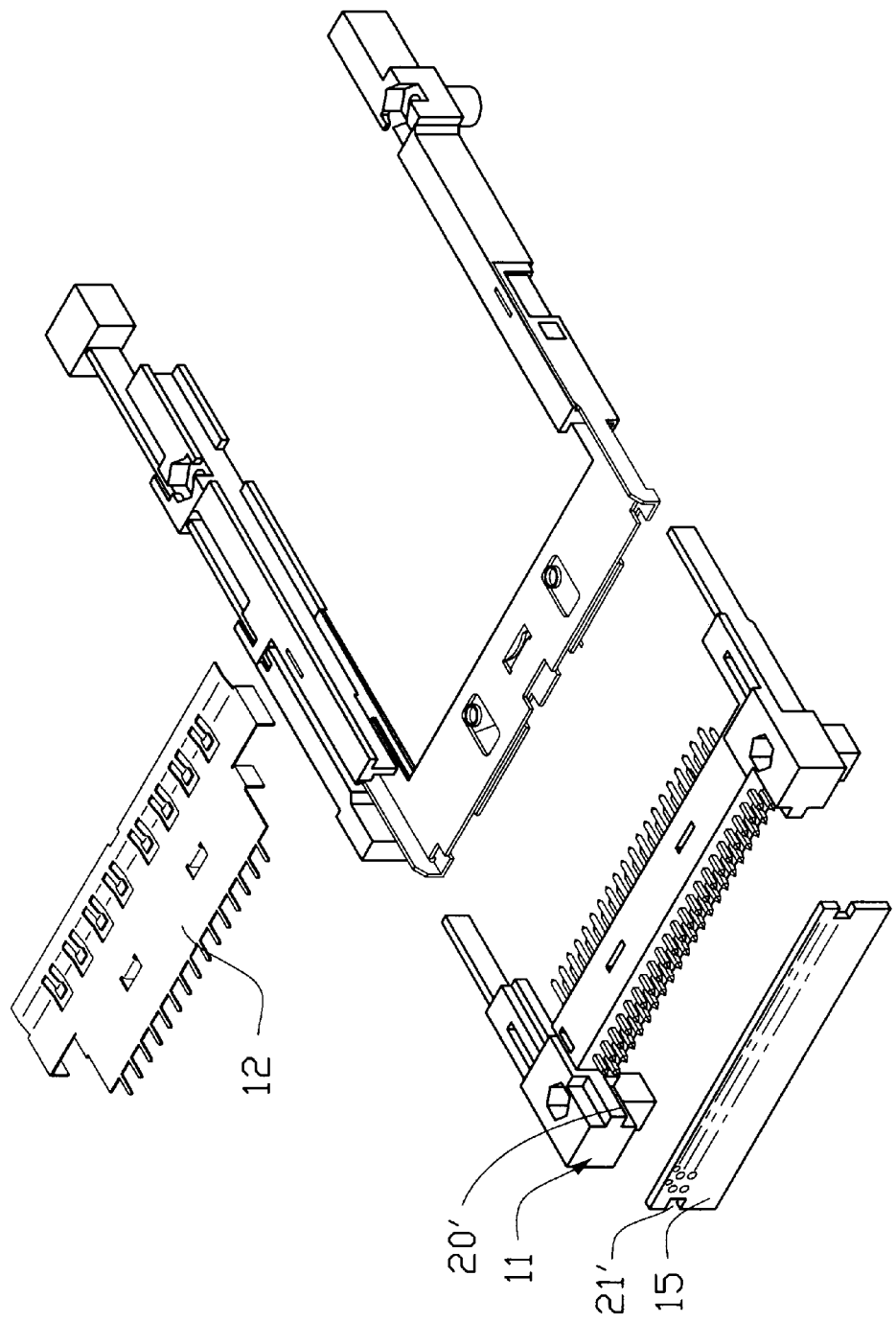
FIG. 4 is an exploded, perspective view of the card connector in accordance with a third embodiment of the present invention.

FIGS. 3 and 4 respectively show a second and third embodiment of the present invention, wherein the upper and lower housings 10, 11 of the stacked connector are separated to independently form single card connectors.

The above descriptions reveal that the card connector 1 in accordance with the present invention facilitates the alignment and insertion of the contacts 13, 13' of each housing 10, 11 through the through holes 141, 151 defined in the corresponding daughter board 14, 15. In addition, the daughter boards 14, 15 are firmly secured to the connector 1 thereby preventing complications arising from an offset of the two components during a soldering operation. Furthermore, the connector 1 does not require the use of external tools to mount the connector 1 to the mother board thereby reducing manufacturing costs. Thus, the present invention is novel and advantageous over the prior art, and qualifies to be granted a patent.

While the present invention has been described with reference to specific embodiments, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

We claim:

1. A card connector comprising:

a plurality of stacked insulative housings each including a contact receiving chamber having an inserting port and a soldering port with contact receiving holes defined therethrough;

an arm formed at each end of each contact receiving chamber thereby defining a contact receiving space between the two arms and the soldering port of each housing;

a plurality of conductive contacts received in the contact receiving chamber and protruding from both the soldering and inserting ports thereof;

a plurality of daughter boards corresponding to the number of housings each defining a plurality of through holes in a surface thereof; and guiding and fastening means located between each housing and each corresponding daughter board for guiding the contacts protruding from the soldering port of each housing through the through holes defined in the corresponding daughter board and securely fastening the daughter board to the corresponding housing wherein one of the daughter boards which cooperates with a lower connector, is substantially positioned within the corresponding contact receiving space and inwardly spaced away from a front face of the arm of the corresponding housing while another of the daughter boards which cooperates with an upper connector, is substantially attached to the front face of the arm of the corresponding housing whereby said two daughter boards are spatially aligned substantially parallel to each other.

2. An arrangement of combining a number of daughter boards to a corresponding number of connectors stacked on each other, each said connector having an insulative housing with a plurality of contacts received therein and extending forward therefrom, each said daughter boards including a corresponding number of through holes for respectively receiving said corresponding contacts therein, wherein said arrangement further includes plural sets of guiding/fastening means each for guiding and securely fastening the connector to the corresponding daughter board, wherein one set of said guiding/fastening means includes a pair of deformable posts each forwardly extending from a front face of an arm of the housing of an upper connector for cooperation with a hole in a first daughter board while another set of said guiding/fastening means includes a guiding protrusion formed on an inner side of each arm of each housing of an upper connector for respective insertion in notches defined in opposing lateral ends of a second daughter board, so that said first daughter board and said second daughter board can be aligned substantially parallel to each other.

* * * * *